United States Patent [19]
Massingill et al.

[11] Patent Number: 5,413,964
[45] Date of Patent: May 9, 1995

[54] PHOTO-DEFINABLE TEMPLATE FOR SEMICONDUCTOR CHIP ALIGNMENT

[75] Inventors: Thomas J. Massingill, Scotts Valley; William M. Loh, Sunnyvale, both of Calif.

[73] Assignee: Digital Equipment Corporation, Maynard, Mass.

[21] Appl. No.: 720,262

[22] Filed: Jun. 24, 1991

[51] Int. Cl.⁶ .................................. H01L 31/60
[52] U.S. Cl. .................. 437/209; 437/211; 437/214; 437/217; 437/220
[58] Field of Search ............... 437/209, 211, 214, 215, 437/217, 220; 351/72, 80

[56] References Cited

U.S. PATENT DOCUMENTS

| | | | |
|---|---|---|---|
| 3,191,100 | 6/1965 | Sorvillo | 317/101 |
| 3,457,639 | 7/1969 | Weller | 29/626 |
| 3,516,155 | 6/1970 | Smith | 29/626 |
| 3,540,121 | 11/1970 | Hutchinson et al. | 29/626 |
| 3,931,922 | 1/1976 | Jackson et al. | 228/6 |
| 4,371,912 | 2/1983 | Guzik | 361/417 |
| 4,698,662 | 10/1987 | Young et al. | 357/80 |
| 4,957,882 | 9/1990 | Shinomiya | 437/209 |

FOREIGN PATENT DOCUMENTS

| | | | |
|---|---|---|---|
| 61-208227 | 9/1986 | Japan | 437/209 |
| 62-26874 | 2/1987 | Japan | 437/209 |

Primary Examiner—Brian E. Hearn
Assistant Examiner—Kevin M. Picardat
Attorney, Agent, or Firm—Arnold, White & Durkee

[57] ABSTRACT

A semiconductor chip having a number of bonding pads on one face is mounted on a set of matching, mirror-image bonding pads on a packaging substrate, in a flip chip configuration. An alignment template is formed on and permanently secured to the substrate, and takes the form of a frame surrounding the substrate bonding pads. The height of the template is sufficient to receive the edges of the chip and hold the chip in place while the assembly is being transported to the soldering operation. No alignment operation is required, since the chip is merely placed in the receptacle formed by the template. The template is of course aligned with the substrate bonding pads when the template is created. The template can be formed on the substrate using photolithographic techniques, and, preferably, the template itself is formed of a photo-definable material.

13 Claims, 1 Drawing Sheet

PHOTO-DEFINABLE TEMPLATE FOR SEMICONDUCTOR CHIP ALIGNMENT

BACKGROUND OF THE INVENTION

This invention relates to semiconductor devices, and more particularly to a method of aligning and holding semiconductor chips when mounting onto a package substrate.

When a semiconductor chip containing an integrated circuit is mounted face down, i.e., with the active circuitry toward the substrate, this is referred to as flip-chip assembly. Usually bonding pads are formed on the chip, and a matching, mirror-image set of bonding pads is formed on the substrate to receive the chip pads. Metallic bumps may be formed on the pads to facilitate bonding. The assembly must be subjected to a soldering operation, e.g., reflow soldering, to secure the mating pads on the chips and substrate. Alignment of the semiconductor chips in flip chip assembly of this type has been done using a specially-constructed jig employing split-field optics to align the chip pads to the substrate pads; the chips are then reflow soldered on this equipment, or else transported to a reflow furnace for permanent attachment. In either method, flux is ordinarily used. If the reflow is performed on the alignment equipment then flux is required to clean the oxides on the solder, because it is difficult to build an enclosure around the alignment and reflow mechanisms to exclude oxygen. If the reflow is performed in a separate system, then tack flux is used to maintain the chips in place, aligned with the substrate pads, during the transport from the alignment mechanism to the reflow equipment.

Not only does the method just described require the construction of specialized alignment equipment, but also the required flux introduces contaminants. Cleaning steps must be added to the assembly operation to remove the flux and its remanents, and, even so, constraints are placed on the metallurgies and process flow when the necessity of flux is introduced. In addition, the possibility of misalignment, and thus lowered yield, is presented.

In U.S. Pat. No. 3,457,639, a method of alignment of microcircuit devices on a substrate is disclosed which uses a photoresist wall on a printed circuit board to align tabs on integrated circuit packages to metal strips on the substrate. In the process disclosed in the patent, the emphasis is on aligning the tabs with the strips, where the tabs are themselves visible, as is the conductive pattern on the substrate. This process of the patent does not address the problems inherent in aligning bumps hidden by a silicon chip when mounting on pads on a substrate.

SUMMARY OF THE INVENTION

In accordance with one embodiment of the invention, a semiconductor chip having a number of bonding pads on one face is mounted on a set of matching, mirror-image bonding pads on a packaging substrate, in a flip chip configuration. An alignment template is formed on and permanently secured to the substrate, and takes the form of a frame surrounding the substrate bonding pads. The height of the template is sufficient to receive the edges of the chip and hold the chip in place while the assembly is being transported to the soldering operation. No alignment operation is required, since the chip is merely placed in the receptacle formed by the template. The assembly, with the chip in place, held by the template, is then transported to the soldering operation, if soldering is employed. The template is of course aligned with the substrate bonding pads when the template is created. The template can be formed on the substrate using photolithographic techniques, and, preferably, the template itself is formed of a photo-definable material.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

DETAILED DESCRIPTION OF SPECIFIC EMBODIMENTS

Figure 1:
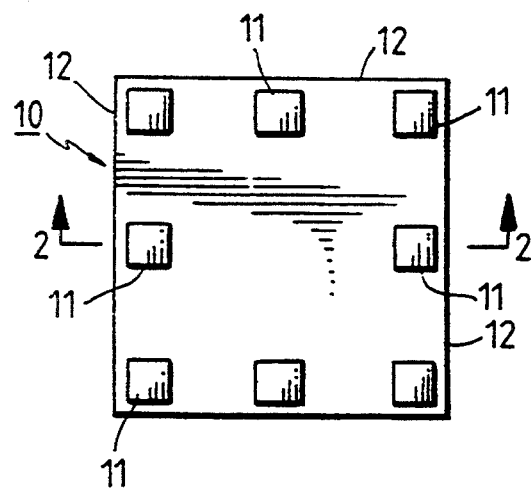
FIG. 1 is a plan view of a semiconductor chip for mounting on a substrate according to one embodiment of the invention.
Figure 2:
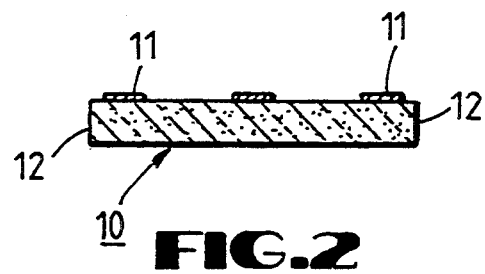
FIG. 2 is an elevation view in section of the semiconductor chip of FIG. 1.

Referring to FIGS. 1 and 2, a semiconductor chip 10 is shown which may be mounted on a circuit board using a template alignment method according to one embodiment of the invention. The chip 10 has a number of bonding pads 11 thereon, which are connected to circuitry internal to the chip, not shown. The chip is typically a single crystal silicon die having a memory, microprocessor or logic circuit fabricated therein by VLSI techniques, and various input, output and power supply nodes of the circuit are terminated in these pads 11. The pads 11 are aligned in some precise pattern with the edges 12 of the chip 10, and of course are internally aligned with metallization patterns buried beneath the face of the chip. Other than the pads 11, the face of the chip is covered with an insulator material so is non-conductive.

Figure 3:
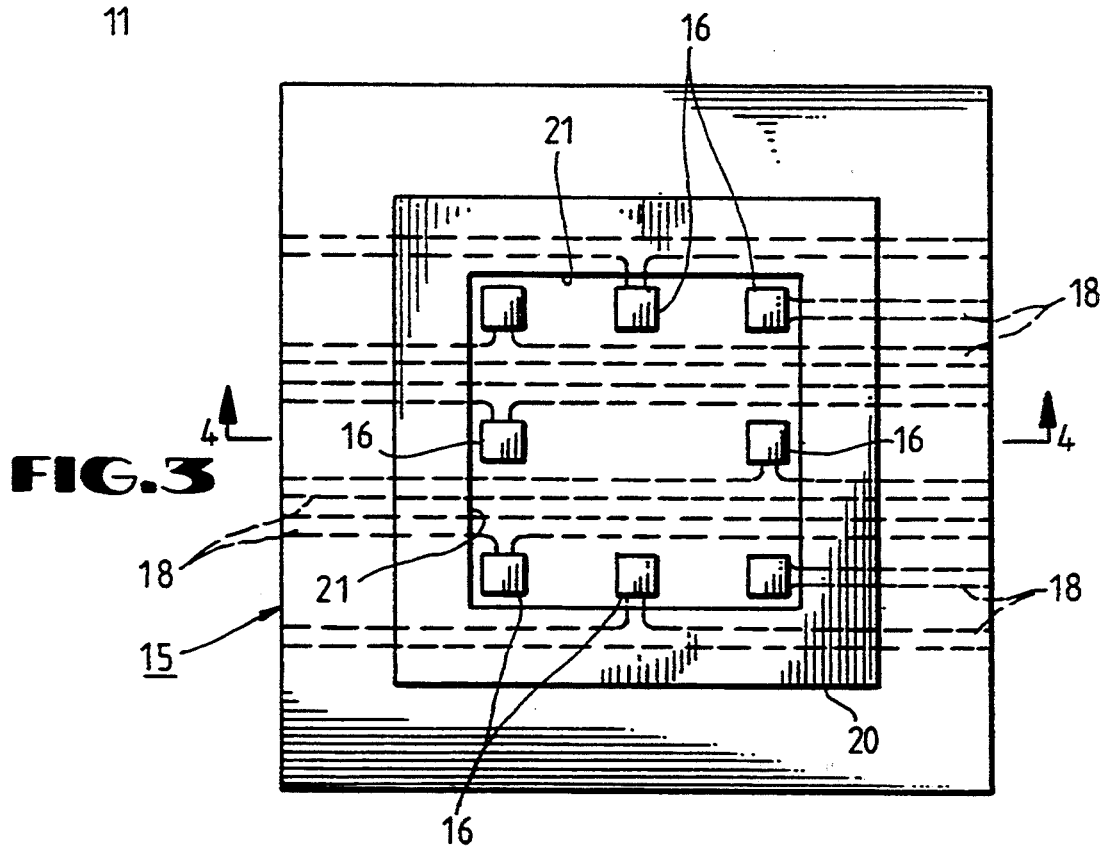
FIG. 3 is a plan view of a substrate having bonding pads and an alignment template for receiving the chip of FIGS. 1 and 2, according to an embodiment of the invention.
Figure 4:
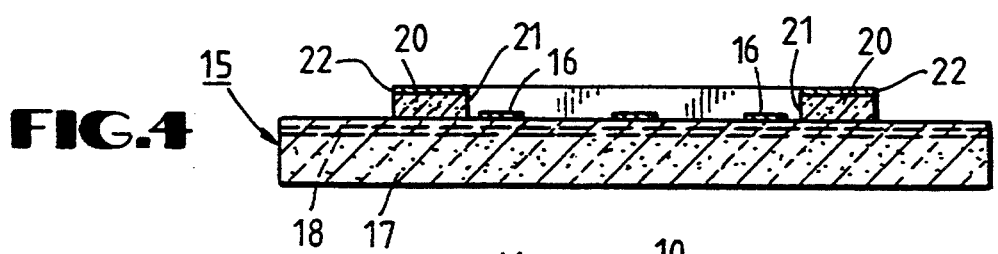
FIG. 4 is an elevation view in section of the substrate of FIG. 3.

In FIGS. 3 and 4, a substrate 15 is shown having pads 16 matching the pads 11 of the chip 10. The pads 16 are aligned with one another in the same physical positions, in mirror image, as the pads 11. The body 17 of the substrate 15 is usually an insulator material such as ceramic or the like, or at least has a non-conductive coating on its upper surface. A number of conductors 18 are plated or otherwise deposited on the upper face to connect the pads 16 to other parts of the system. Often a number of sites are included on the face of the substrate 15 for mounting a number of the chips 10, only one being shown for illustrative purposes.

Figure 5:
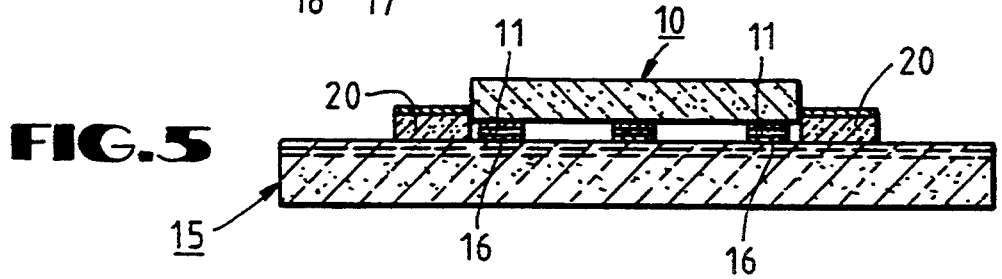
FIG. 5 is view as in FIG. 4 at a stage in the process according to the invention after the chip is in place.

According to the invention, an alignment template 20 is formed on the top face of the substrate 15, shaped to receive the chip 10 and hold it in place while the pads 11 are bonded to the pads 16. The inner edges 21 of the template 20 are precisely aligned with respect to the pads 16 so that when the chip 10 is in place as seen in FIG. 5, aligned with the inner edges of the template, the pads 11 fit precisely over top of the pads 16. The size and shape of the inner edges 21 of the template are such that enough clearance is allowed for process variations in chip size and shape, but still providing sufficient alignment of the pads.

The template 20 is fabricated by photolithographic process steps as ordinarily used to form the pattern of conductors 18 and the pads 16 on the face of the substrate 15. For example, the template 15 may be fabricated using photosensitive organic material commonly referred to as photoresist, such as KMER, commercially available from Kodak, used in manufacture of etched circuit boards. That is, a thick coating of photoresist is applied, to a thickness corresponding to the thickness of the pads 11 and 16, perhaps 3- or 4-mils for a pad thickness of about 1-mil. The template is thick enough to adequately hold the chip 10 in place. The coating of photoresist is exposed to light through a mask aligned with the pads 16, and developed to remove the photoresist everywhere except as seen in FIGS. 3–5 to leave the template 20. The template described above is an organic template. A metal or inorganic template can be formed using photoresist as a pattern, and electroplating the template through standard plating processes used in manufacture of printed wire boards.

The chips 10 are aligned with the templates 20 on the substrate 15 manually (using tweezers or a vacuum wand to grasp the chips) employing a low power microscope, e.g., 6–40 magnification). The chips are perhaps 450 mils on a side. Alignment is accomplished by merely placing the chip into the template 20. The accuracy of fabricating the template edge 21 is within <4- micron, using standard photolithographic methods. The clearance between chip edges 12 and inner edges 21 of the template may be perhaps 0.5 to 1.0 mils, so the final alignment of chip pads 11 to substrate pads 16 is +/−1-mil.

Soldering or bonding the chip pads 11 to the substrate pads 16 may be accomplished by merely heating the assembly, if the pads are plated with a solder material before assembly.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of securing a chip to a substrate, wherein the chip has conductive pads on selected limited areas of one face and the substrate has conductive pads in mirror image on a mating face, comprising the steps of:
    a) forming a template in situ and adhered to said mating face with inner edges of the template aligned with said conductive pads on the substrate within the template, the template being shaped to receive said chip; and
    b) placing said face of the chip on said face of the substrate within and aligned with said edges of said template so that said conductive pads on said one face of the chip are aligned with and contacting said conductive pads on said mating substrate.

2. A method according to claim 1 wherein said template is comprised of a photosensitive material and is formed by a photomasking step.

3. A method according to claim 1 wherein said template is comprised of an inorganic material and is formed by photomasking.

4. A method according to claim 1 wherein said chip is a silicon die having a semiconductor integrated circuit formed therein.

5. A method according to claim 1 wherein said conductive pads are metal.

6. A method according to claim 1 including the step of bonding said pads of the chip to said pads of said substrate.

7. A method according to claim 1 wherein said template has a height exceeding that of said conductive pads.

8. A method according to claim 1 wherein said substrate is composed of an insulating material having a plurality of conductors formed on said face coupled to said conductive pads.

9. A method of bonding a semiconductor integrated circuit chip to an insulating substrate, wherein the chip has metal bonding pads on selected limited areas of one face and the substrate has metal bonding pads in mirror image on a mating face, comprising the steps of:
    a) forming a template in situ and adhered to said mating face with inner edges of the template surrounding and aligned with said bonding pads on the substrate and shaped to receive said chip;
    b) placing said face of the chip on said face of the substrate within and aligned with said edges of said template so that said bonding pads on said one face of the chip are aligned with and contacting said bonding pads on said substrate; and
    c) bonding said pads of the chip to said pads of said substrate.

10. A method according to claim 9 wherein said template is comprised of a photosensitive material and is formed by a photomasking step.

11. A method according to claim 9 wherein said template is comprised of inorganic material and is formed by a photomasking step.

12. A method according to claim 9 wherein said template has a height exceeding that of said bonding pads.

13. A method according to claim 9 wherein said substrate has a plurality of conductors formed on said face coupled to said bonding pads.

* * * * *